US005709977A

United States Patent [19]
Tan et al.

[11] Patent Number: 5,709,977
[45] Date of Patent: Jan. 20, 1998

[54] POSITIVE WORKING PHOTORESIST COMPOSITION

[75] Inventors: Shiro Tan; Yasumasa Kawabe, both of Haibara-gun, Japan

[73] Assignee: Fuji Photo Film Co., Ltd., Kanagawa, Japan

[21] Appl. No.: 677,143

[22] Filed: Jul. 9, 1996

[30] Foreign Application Priority Data

Jul. 13, 1995 [JP] Japan ........................... 7-177655

[51] Int. Cl.⁶ .................................... G03F 7/023
[52] U.S. Cl. .................. 430/192; 430/191; 430/193
[58] Field of Search ........................ 430/165, 192, 430/193, 191

[56] References Cited

U.S. PATENT DOCUMENTS

| | | | |
|---|---|---|---|
| 5,208,138 | 5/1993 | Lazarus et al. | 430/192 |
| 5,266,440 | 11/1993 | Zampini | 430/192 |
| 5,302,490 | 4/1994 | Fedynyshyn et al. | 430/271 |
| 5,468,590 | 11/1995 | Hashimoto et al. | 430/192 |

FOREIGN PATENT DOCUMENTS

A-0336604  10/1989  European Pat. Off. .
A-0676668  10/1995  European Pat. Off. .

OTHER PUBLICATIONS

Database WPI, Week 9108, Derwent Publications Ltd., London, GB; AN 91-053474 & JP-A-02 300 751 (Mitsubishi Petroch KK).

Database, WPI Week 8646, Derwent Publications Ltd., London, GB; AN 86-301835 & JP-A-61 223 735 (Japan Synthetic Rubber) Abstract.

Primary Examiner—John S. Chu
Attorney, Agent, or Firm—Sughrue, Mion, Zinn, Macpeak & Seas PLLC

[57] ABSTRACT

Provided is a positive working photoresist composition which comprises a 1,2-quinonediazide compound and an alkali-soluble resin obtained by condensing a specified phenol compound, formaldehyde and a specified aromatic aldehyde having at least one alkoxy substituent and at least one hydroxy substituent.

7 Claims, No Drawings

POSITIVE WORKING PHOTORESIST COMPOSITION

FIELD OF THE INVENTION

The present invention relates to a positive working photoresist composition responsive to radiation. More particularly, the invention relates to a photoresist composition suitable for use in fine processing which has high resolving power, wide defocus latitude, high heat resistance, and deep ultraviolet (Deep UV) curability high enough to provide dry etching resistance.

The positive working photoresist composition of the present invention is coated in a thickness of 0.5–3 μm on a substrate, such as semiconductor wafer, glass, ceramics or metal, by a spin or roller coating method. The coating thus obtained is heated, dried, irradiated with UV or so on via an exposure mask to print thereon a circuit pattern or the like, and then developed to provide a positive image.

Further, this positive image is used as a mask in an etching operation, and thereby a pattern is formed on the substrate. The photoresist is typically applied to production of semiconductor devices, such as IC, and circuit substrates for liquid crystals, thermal heads and the like, and to other photofabrication processes.

BACKGROUND OF THE INVENTION

A generally used positive working photoresist composition comprises an alkali-soluble resin (e.g., novolak resin) and a naphthoquinonediazide compound as a photosensitive material.

Naphthoquinonediazide compounds used as photosensitive materials are unique in having a property that the compounds themselves function as dissolution inhibitor to lower the solubility of a novolak resin in alkali; but, when irradiated with light, they decompose to produce alkali-soluble substances, and thereby to rather promote dissolution of a novolak resin in alkali. Owing to such a great change produced in property by light, naphthoquinonediazide compounds are particularly useful as the photosensitive materials of positive working photoresist compositions.

Novolak resins used as binder, on the other hand, are soluble in an alkali aqueous solution without swelling therein, and provide images which can offer high resistance to plasma etching when used as mask upon etching. Therefore, they are useful in particular for the present purposes.

For instance, the combinations of novolak-type phenol resins with naphthoquinonediazido-substituted compounds are disclosed, e.g., in U.S. Pat. Nos. 3,666,473, 4,115,128 and 4,173,470, and the combinations of novolak resins prepared from cresol and formaldehyde with trihydroxybenzophenone-1,2-naphthoquinonediazide sulfonic acid esters are described as most typical compositions in L. F. Thompson, *Introduction to Microlithography*, No. 219, pp. 112–121, ACS publisher.

In addition, JP-A-06-242601 (the term "JP-A" as used herein means an "unexamined published Japanese patent application") describes the novolak resin obtained by reacting phenolic compounds (phenol, m-/p-cresol, xylenol) with aldehydes including aromatic aldehydes (benzaldehyde, hydroxybenzaldehyde) in the presence of an acid catalyst, and further condensing the reaction product, phenols and formaldehyde without isolating low molecular weight components from the reaction product. Therein, it is also described that a photopolymer composition which is well balanced among characteristics, including definition and profile of the image formed therefrom, sensitivity, depth of focus, heat resistance and so on, and free from scum can be obtained by incorporating an o-naphthoquinonediazide compound in the novolak resin obtained in the foregoing process.

Further, the photoresist composition containing the novolak resin as a condensate of aromatic aldehydes (benzaldehyde, salicylaldehyde), phenols (phenol, m-/p-cresol, xylenol, naphthol, bisphenol) and, if desired, formaldehyde in combination with an o-quinonediazide compound is described in U.S. Pat. No. 5,266,440. The characteristic of such a photoresist composition is high heat resistance.

Furthermore, the novolak resin prepared from phenolic compounds (phenol, m-/p-cresol), formaldehyde and a monohydroxy aromatic aldehyde is disclosed in JP-A-02-84414. This reference further describes that a positive working photoresist having heat resistance and high resolving power is obtained by using the aldehyde mixture of formaldehyde with a monohydroxy aromatic aldehyde in the preparation of novolak resin.

Also, JP-02-300751 discloses the positive working photoresist composition containing the novolak resin obtained by condensing a phenol compound and a hydroxy aromatic aldehyde in combination with a photosensitive agent. This photoresist composition is characterized by a great change produced in development speed by alterations in exposure amount, that is to say, a great γ value.

In the manufacture of semiconductor substrates for super-LSI and the like, processing of superfine patterns having a line width of no broader than 1 μm is needed. In order to answer such a purpose, it is required for photoresist to have very high resolving power, wide defocus latitude, high heat resistance, highly precise reproducibility of pattern shape by which exact copying of the shape of an exposure mask is enabled, and high sensitivity from the viewpoint of high productivity. Under the present situation, however, conventional positive working photoresists as cited above cannot cope with those severe performance requirements.

In recent years, severer dry etching conditions have come to be employed from the viewpoint of throughput improvement; as a result, there is an increasing tendency to adoption of the so-called "Deep UV curing method", or the method in which a resist pattern formed by exposure and subsequent development with an alkaline solution is cured by irradiation with deep ultraviolet rays under heating (cf. the paper of Masataka Endo et al., entitled 'Effects of Deep UV Irradiation upon Positive Working Photoresist and Application thereof to Lithography', published in *Kobunshi Ronbunshu*, vol. 45, No. 10, pp. 771–776 (Oct., 1988)). However, conventional novolak resins as cited above, including those prepared mainly from phenol, cresol and xylenol and those obtained by the simple co-condensation using aromatic aldehydes, cannot be cured to a sufficient extent by irradiation with Deep UV.

SUMMARY OF THE INVENTION

Therefore, objects of the present invention are to provide:

(1) a positive working photoresist composition which has high resolving power, (2) a positive working photoresist composition which has wide defocus latitude, (3) a positive working photoresist composition which produces a resist image having high heat resistance, and (4) a positive working photoresist composition which is highly curable under irradiation with Deep UV; especially which are suitable for the manufacture of semiconductor devices.

As a result of our intensive studies made as much account is taken of the aforementioned characteristics, it has been found that the foregoing objects can be attained by the combined use of a specified alkali-soluble novolak resin and a quinonediazide compound, thereby achieving the present invention.

More specifically, the objects of the present invention are attained with a positive working photoresist composition which comprises an alkali-soluble resin and a 1,2-quinonediazide compound, with the alkali-soluble resin being a novolak resin prepared by condensing a phenol compound represented by the following formula (I), formaldehyde and an aromatic aldehyde compound represented by the following formula (II);

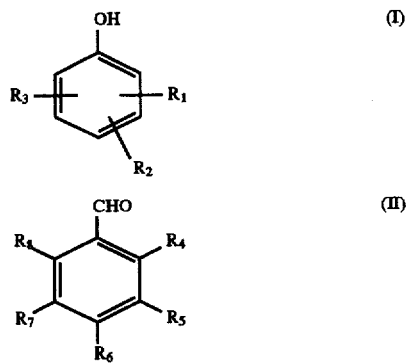

wherein $R_1$, $R_2$ and $R_3$ are the same or different, and each represents a hydrogen atom, a hydroxyl group, a halogen atom, an alkyl group, a cycloalkyl group, an alkoxy group, an alkenyl group, an aryl group, an aralkyl group, an alkoxycarbonyl group or an arylcarbonyl group; and $R_4$ to $R_8$ are the same or different, and each represents a hydrogen atom, a hydroxyl group, a formyl group, a halogen atom, an alkyl group, a cycloalkyl group, an alkoxy group, an alkenyl group, an aryl group, an aralkyl group or a nitro group; provided that at least one of $R_4$ to $R_8$ is a hydroxyl group and at least one of the residual substituents is an alkoxy group.

In accordance with the present invention, a specified novolak resin obtained by condensing a phenol compound represented by formula (I), formaldehyde and an aromatic aldehyde represented by formula (II) is used as alkali-soluble resin, and thereby not only high resolving power, wide defocus latitude and high heat resistance but also excellent Deep UV curability to provide dry etching resistance can be ensured for a positive working photoresist.

The positive working photoresist according to the present invention can be used appropriately for dry etching process which requires heat resistance in particular.

DETAILED DESCRIPTION OF THE INVENTION

With respect to $R_1$ to $R_3$ in formula (I), a chlorine atom, a bromine atom or an iodine atom is preferred as the halogen atom, and a chlorine atom is more preferable. As for the alkyl group, those containing 1 to 4 carbon atoms, such as methyl, ethyl, propyl, n-butyl, isobutyl, sec-butyl and t-butyl groups, are suitable examples thereof. Of these alkyl groups, a methyl group is preferred over the others from the viewpoint of sensitivity. Suitable examples of a cycloalkyl group for $R_1$ to $R_3$ include a cyclopropyl group, a cyclopentyl group, a cycloheptyl group and cyclooctyl group. Of these groups, a cyclohexyl group is preferred over the others. Suitable examples of an alkoxy group for $R_1$ to $R_3$ include those containing 1 to 4 carbon atoms, such as methoxy, ethoxy, hydroxyethoxy, propoxy, hydroxypropoxy, isopropoxy, n-butoxy, isobutoxy, sec-butoxy and tert-butoxy groups. Of these groups, methoxy and ethoxy groups are preferred over the others. Suitable examples of an alkenyl group for $R_1$ to $R_3$ include those containing 2 to 4 carbon atoms, such as vinyl, propenyl, allyl and butenyl groups. Of these groups, vinyl and allyl groups are preferred over the others. Suitable examples of an aryl group for $R_1$ to $R_3$ include a phenyl group, a xylyl group, a toluyl group and a cumenyl group. Of these groups, a phenyl group is preferred over the others. As for the aralkyl group, a benzyl group, a phenetyl group and a cumyl group are preferable, and a benzyl group is more preferable. As for the alkoxycarbonyl group, a methoxycarbonyl group and an ethoxycarbonyl group are preferable, and a methoxycarbonyl group is more preferable. As for the arylcarbonyl group, a benzoyloxy group is preferred.

Additionally, the substituents $R_1$ to $R_3$ may be identical with or different from one another. Further, each substituent has no particular restriction as to the position at which it is attached to the benzene nucleus.

Specific examples of phenols represented by formula (I) include cresols, such as phenol, o-cresol, m-cresol and p-cresol; xylenols, such as 2,3-xylenol, 2,5-xylenol, 3,5-xylenol, 3,4-xylenol, 2,4-xylenol and 2,6-xylenol; alkylphenols, such as o-ethylphenol, m-ethylphenol, p-ethylphenol and p-t-butylphenol; alkoxyphenols, such as o-methoxyphenol, m-methoxyphenol, p-methoxyphenol, o-ethoxyphenol, m-ethoxyphenol, p-ethoxyphenol, 3,5-dimethoxyphenol, 2-methoxy-4-methylphenol, o-propoxyphenol, m-propoxyphenol, p-propoxyphenol, o-butoxyphenol, m-butoxyphenol and p-butoxyphenol; alkenylphenols, such as o-vinylphenol, m-vinylphenol, p-vinylphenol, o-allylphenol, m-allylphenol and p-allylphenol; trimethylphenols, such as 2,3,5-trimethylphenol, 3,4,5-trimethylphenol and 2,3,6-trimethylphenol; arylphenols, such as o-phenylphenol, m-phenylphenol and p-phenylphenol; aralkylphenols, such as o-benzylphenol, m-benzylphenol and p-benzylphenol; alkoxycarbonylphenols, such as o-methoxycarbonylphenol, m-methoxycarbonylphenol and p-methoxycarbonylphenol; arylcarbonylphenols, such as o-benzoyloxyphenol, m-benzoyloxyphenol and p-benzoyloxyphenol; halogenated phenols, such as o-chlorophenol, m-chlorophenol and p-chlorophenol; and polyhydroxybenzenes, such as catechol, resorcinol, hydroquinone, phloroglucinol and pyrogallol. However, it should be understood that those examples are not to be construed as limiting the scope of the invention.

In addition to those phenols, methylol compounds of phenols, such as bishydroxymethyl-p-cresol, can also be used.

Of those phenols, phenol, cresols, xylenols and trimethylphenols are preferably used. In particular, m-cresol, p-cresol, o-cresol, 2,3-xylenol, 2,5-xylenol, 3,5-xylenol, 2,6-xylenol, 3,4-xylenol and 2,3,5-trimethylphenol are more preferred.

Further, the phenol compounds of formula (I) can be used in combination with other phenol compounds. Suitable examples of phenol compounds for the combined use include the polyhydric phenols having 2 to 5 aromatic rings as described, e.g., in JP-A-05-181270, JP-A-05-323604, JP-A-05-249666, JP-A-05-232696, JP-A-60-164740, JP-A-

05-323605, JP-A-04-226458, JP-A-05-188590 and JP-A-07-72623. Of those polyhydric phenols, 2,2,-dihydroxy-5,5'-dimethyldiphenylmethane is preferred in particular. It is desirable that such a polyhydric phenol be used in a proportion of no greater than 30 mole %, preferably no greater than 20 mole %, to the phenol compound of formula (I). If the proportion of a polyhydric phenol is within the foregoing range, the combined use is desirable from the viewpoint of sensitivity.

With respect to the substituents $R_4$ to $R_8$ in formula (II) illustrated hereinbefore, a suitable halogen atom is a chlorine, bromine or iodine atom, and a chlorine atom is preferable to the others. As for the alkyl group for $R_4$ to $R_8$, those containing 1 to 4 carbon atoms, such as methyl, ethyl, propyl, n-butyl, isobutyl, sec-butyl and t-butyl groups, are suitable examples thereof. Of these alkyl groups, a methyl group is preferred over the others from the viewpoint of sensitivity. Suitable examples of a cycloalkyl group for $R_4$ to $R_8$ include a cyclopropyl group, a cyclopentyl group, a cyclohexyl group, a cycloheptyl group and a cyclooctyl group. Of these groups, a cyclohexyl group is preferred over the others. Suitable examples of an alkoxy group for $R_4$ to $R_8$ include those containing 1 to 4 carbon atoms, such as methoxy, ethoxy, hydroxyethoxy, propoxy, hydroxypropoxy, isopropoxy, n-butoxy, isobutoxy, sec-butoxy and tert-butoxy groups. Of these groups, methoxy and ethoxy groups are preferred over the others. Suitable examples of an alkenyl group for $R_4$ to $R_8$ include those containing 2 to 4 carbon atoms, such as vinyl, propenyl, allyl and butenyl groups. Of these groups, vinyl and allyl groups are preferred over the others. Suitable examples of an aryl group for $R_4$ to $R_8$ include a phenyl group, a xylyl group, a toluyl group and a cumenyl group. Of these groups, a phenyl group is preferred over the others. As for the aralkyl group represented by $R_4$ to $R_8$, a benzyl group, a phenetyl group and a cumyl group are preferable, and a benzyl group is more preferable.

For the substituents $R_4$ to $R_8$, however, it is required that at least one of them be a hydroxyl group, although the hydroxyl group has no particular restriction as to the position at which it is attached to the benzene nucleus. Further, at least one of the residual substituents has to be an alkoxy group. The alkoxy substituent also has no particular restriction as to the position at which it is attached, but the number of the alkoxy substituent is preferably 1 or 2.

Specific examples of aromatic aldehydes represented by formula (II) are illustrated below. However, compounds usable in the invention should not be construed as being limited to these examples.

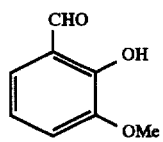
(1)

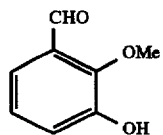
(2)

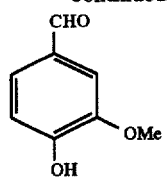
(3)

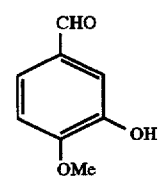
(4)

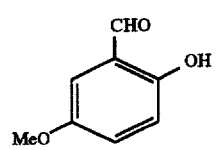
(5)

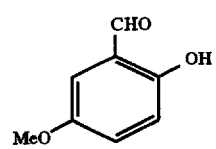
(6)

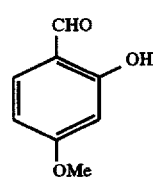
(7)

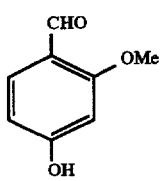
(8)

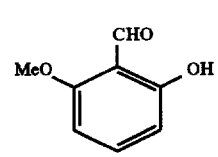
(9)

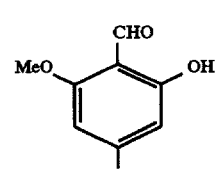
(10)

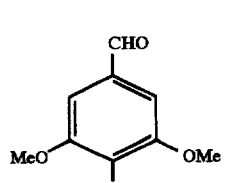
(11)

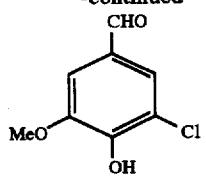 (12)
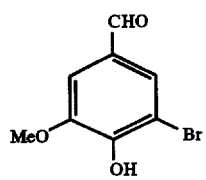 (13)
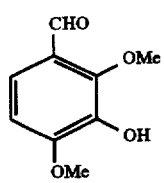 (14)
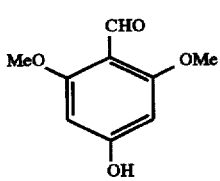 (15)
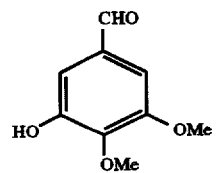 (16)
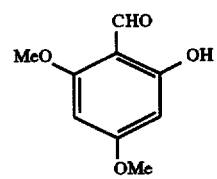 (17)
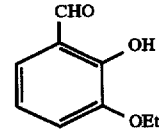 (18)
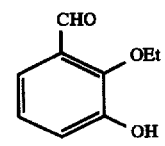 (19)
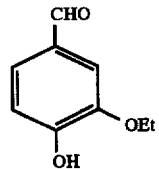 (20)
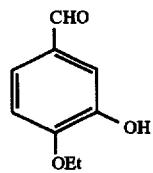 (21)
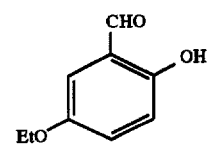 (22)
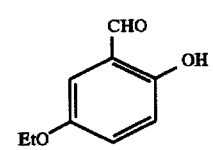 (23)
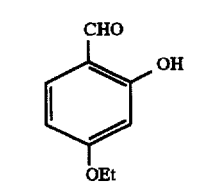 (24)
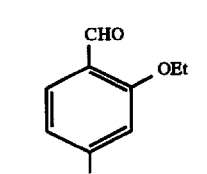 (25)
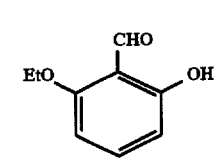 (26)
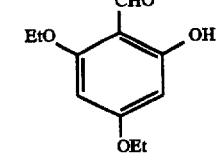 (27)
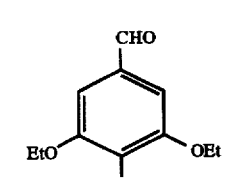 (28)
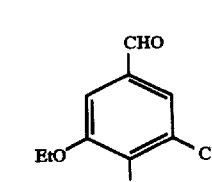 (29)

(30) 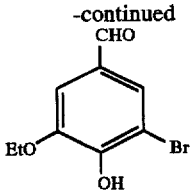

(31) 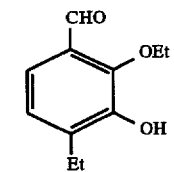

(32) 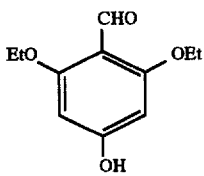

(33) 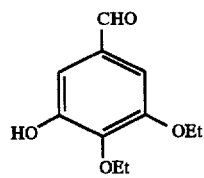

(34) 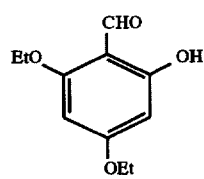

(35) 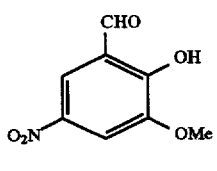

(36) 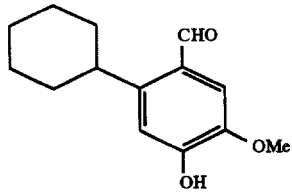

(37) 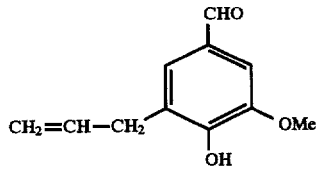

(38) 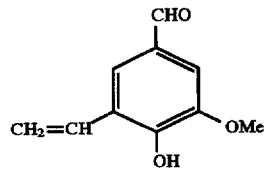

(39) 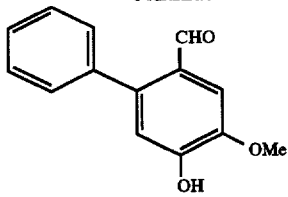

(40) 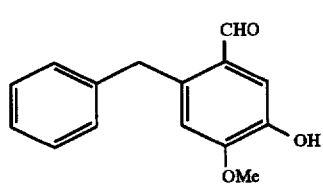

(41) 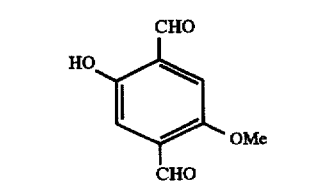

In mixing phenols represented by formula (I), formaldehyde and aromatic aldehydes represented by formula (II), the proportions of these three constituents have no particular limitation so far as aromatic aldehydes are used in a quantity necessary to fully achieve the effects of the present invention. However, it is desirable that the proportion of aromatic aldehydes be not greater than 40 mole %, preferably from 0.1 to less than 30 mole %, to 100 mole % of phenols represented by formula (I), or 100 mole % of total phenols in case of the combined use with other phenols. If the proportion of aromatic aldehydes is within the foregoing range, the resultant condensates are excellent in sensitivity.

Especially favorable examples of a combination of a phenol mixture (including phenols other than those of formula (I)) with aromatic aldehydes of formula (II) which can fully achieve the effects of the present invention, and suitable mixing proportions therein are shown below:

Combination (i)
  m-Cresol from 30 mole % to less than 90 mole %
  2,3-xylenol from 10 mole % to less than 70 mole %
  Aromatic aldehydes from 0.1 mole % to less than 40 mole %

More preferably;
  m-Cresol from 30 mole % to less than 80 mole %
  2,3-Xylenol from 20 mole % to less than 70 mole %
  Aromatic aldehydes from 1 mole % to less than 30 mole %

Combination (ii)
  m-Cresol from 30 mole % to less than 90 mole %
  3,5-Xylenol from 10 mole % to less than 70 mole %
  Aromatic aldehydes from 0.1 mole % to less than 40 mole %

More preferably;
  m-Cresol from 30 mole % to less than 80 mole %
  3,5-Xylenol from 20 mole % to less than 70 mole %
  Aromatic aldehydes from 1 mole % to less than 30 mole %

Combination (iii)
  m-Cresol from 30 mole % to less than 90 mole %
  p-Cresol from 1 mole % to less than 5 mole %
  2,3-Xylenol from 10 mole % to less than 70 mole %

Aromatic aldehydes from 0.1 mole % to less than 40 mole %

More preferably;

m-Cresol from 30 mole % to less than 80 mole % p-Cresol from 1 mole % to less than 5 mole %

2,3-Xylenol from 20 mole % to less than 70 mole %

Aromatic aldehydes from 1 mole % to less than 30 mole %

Combination (iv) (free from m-cresol)

2,2'-Dihydroxy-5,5'-dimethyldiphenylmethane from 1 mole % to less than 30 mole % o-Cresol from 1 mole % to less than 20 mole %

2,3-Xylenol from 40 mole % to less than 80 mole %

2,6-Xylenol from 3 mole % to less than 20 mole %

2,3,5-Trimethylphenol from 5 mole % to less than 40 mole %

Aromatic aldehydes from 1 mole % to less than 30 mole %

More preferably;

2,2'-Dihydroxy-5,5'-dimethyldiphenylmethane from 3 mole % to less than 20 mole % o-Cresol from 1 mole % to less than 10 mole %

2,3-Xylenol from 40 mole % to less than 80 mole %

2,6-Xylenol from 3 mole % to less than 20 mole %

2,3,5-Trimethylphenol from 5 mole % to less than 30 mole %

Aromatic aldehydes from 1 mole % to less than 20 mole %

Further, the present invention comprises formaldehyde as essential constituent, and it is desirable for the formaldehyde to be used in a proportion of from 20 to 150 mole %, preferably from 50 to 120 mole %, to 100 mole % of phenols represented by formula (I). When the proportion of formaldehyde is in the aforesaid range, the resultant novolak resin can have its molecular weight in a desirable range.

Also, formaldehyde may be used in the form of precursor, such as paraformaldehyde, trioxane or so on. Further, acetaldehyde, furfural, benzaldehyde, hydroxybenzaldehydes, crotonaldehyde, chloroacetaldehyde or the like can be used as the third aldehyde component.

As for the acid catalyst used for the condensation reaction, hydrochloric acid, sulfuric acid, formic acid, acetic acid, p-toluenesulfonic acid and oxalic acid are examples thereof. Of these acids, oxalic acid and p-toluenesulfonic acid are preferred over the others. These acids can also be used in combination.

The weight-average molecular weight of the novolak resin of the present invention prepared from the aforementioned constituents is desirably from 3,000 to 20,000, more desirably from 4,000 to 18,000, and most desirably from 5,000 to 16,000. When the novolak resin of the present invention has a weight-average molecular weight less than 3,000, the resultant resist film comes to have a great thickness decrease in unexposed areas after development; while when the weight-average molecular weight thereof is greater than 20,000, the development speed becomes so slow to cause a lowering of the sensitivity. The novolak resin of the present invention can achieve most desirable effects when the resin obtained after removing a low molecular weight fraction from the reaction product has its weight-average molecular weight in the aforesaid range. In removing a low molecular weight fraction from the novolak resin, it is advantageous to adopt the arts described, e.g., in JP-A-60-45238, JP-A-60-97347, JP-A-60-140235, JP-A-60-189739, JP-A-64-14229, JP-A-01-276131, JP-A-02-60915, JP-A-02-275955, JP-A-02-282745, JP-A-04-101147 and JP-A-04-122938, specifically including a method of fractional precipitation, a method of fractional dissolution, column chromatography and so on. This is because the adoption of such arts can improve upon resist performances, e.g., scumming, heat resistance and so on. As for the low molecular weight fraction, the percentage of its removal is desirably from 20 to 70, preferably from 30 to 60, by weight. If the removal percentage is in such a range, the novolak resin obtained can have an appropriate distribution of molecular weights.

Herein, the term "weight-average molecular weight" is defined as the value calculated in polystyrene equivalent, which is determined by gel permeation chromatography (GPC).

The dispersion degree of a novolak resin (the ratio of the weight-average molecular weight Mw to the number-average molecular weight Mn, or Mw/Mn) is from 1.5 to 4.0, preferably from 1.8 to 3.5, and more preferably from 2.0 to 3.3. When the dispersion degree is greater than 4.0, performances of the resultant resist, such as the sensitivity, heat resistance and profile, are deteriorated. When the dispersion degree is smaller than 1.5, on the other hand, the synthesis of such novolak resins requires a high level of purification step, and so it is unsuitable from a practical point of view.

Other alkali-soluble resins which can be used together with the alkali-soluble novolak resin of the present invention have no particular restriction as far as they are compatible with novolak resins. However, polyhydroxystyrenes, acetone-pyrogallol resins, acetone-resorcin resins and the like are preferable because they cause no drop in heat resistance.

As for the photosensitive material, 1,2-naphthoquinonediazidesulfonyl esters are used in the present invention, and they can be obtained by the esterification reaction of polyhydroxy compounds as cited below with 1,2-naphthoquinonediazide-5-(and/or -4-)sulfonyl chloride in the presence of a basic catalyst.

As examples of polyhydroxy compounds which can be used in the foregoing esterification, mention may be made of polyhydroxybenzophenones, such as 2,3,4-trihydroxybenzophenone, 2,4,4'-trihydroxybenzophenone, 2,4,6-trihydroxybenzophenone, 2,3,4-trihydroxy-2'-methylbenzophenone, 2,3,4,4'-tetrahydroxybenzophenone, 2,2',4,4'-tetrahydroxybenzophenone, 2,4,6,3',4'-pentahydroxybenzophenone, 2,3,4,2',4'-pentahydroxybenzophenone, 2,3,4,2',5'-pentahydroxybenzophenone, 2,4,6,3',4',5'-hexahydroxybenzophenone and 2,3,4,3',4',5'-hexahydroxybenzophenone; polyhydroxyphenylalkyl ketones, such as 2,3,4-trihydroxyacetophenone, 2,3,4-trihydroxyphenylpentyl ketone and 2,3,4-trihydroxyphenylhexyl ketone; bis((poly)hydroxyphenyl)alkanes, such as bis(2,4-dihydroxyphenyl)methane, bis(2,3,4-trihydroxyphenyl)methane, bis(2,4-dihydroxyphenyl)propane-1, bis(2,3,4-trihydroxyphenyl)propane-1 and nordihydroguaiaretic acid; polyhydroxybenzoic acid esters, such as propyl 3,4,5-trihydroxybenzoate, phenyl 2,3,4-trihydroxybenzoate and phenyl 3,4,5-trihydroxybenzoate; bis(polyhydroxybenzoyl)alkanes or bis(polyhydroxybenzoyl)arenes, such as bis(2,3,4-trihydroxybenzoyl)methane, bis(3-acetyl-4,5,6-trihydroxyphenyl)methane, bis(2,3,4-trihydroxybenzoyl)benzene and bis(2,4,6-trihydroxybenzoyl)benzene;

alkylene-di(polyhydroxybenzoate)'s, such as ethylene glycol di(3,5-dihydroxybenzoate) and ethylene glycol di(3,4,5-trihydroxybenzoate); polyhydroxybiphenyls, such as 2,3,4-biphenyltriol, 3,4,5-biphenyltriol, 3,5,3',5'-biphenyltetrol, 2,4,2',4'-biphenyltetrol, 2,4,6,3',5'-biphenylpentol, 2,4,6,2', 4',6'-biphenylhexol and 2,3,4,2',3',4'-biphenylhexol; bis(polyhydroxy)sulfides, such as 4,4'-thiobis(1,3-dihydroxy) benzene; bis(polyhydroxyphenyl) ethers, such as 2,2',4,4'-tetrahydroxydiphenyl ether; bis(polyhydroxyphenyl) sulfoxides, such as 2,2',4,4'-tetrahydroxydiphenyl sulfoxide; bis(polyhydroxyphenyl)sulfones, such as 2,2',4,4'-diphenylsulfone; polyhydroxytriphenylmethanes, such as tris(4-hydroxyphenyl)methane, 4,4',4"-trihydroxy-3,5,3',5'-tetramethyltriphenylmethane, 4,4',3",4"-tetrahydroxy-3,5,3', 5'-tetramethyltriphenylmethane, 4,4',2", 3", 4"-pentahydroxy-3,5,3',5'-tetramethyltriphenylmethane, 2,3,4,2',3',4'-hexahydroxy-5,5'-diacetyltriphenylmethane, 2,3,4,2',3',4',3", 4"-octahydroxy-5,5'-diacetyltriphenylmethane and 2,4,6,2',4',6'-hexahydroxy-5, 5'-dipropionyltriphenylmethane; polyhydroxyspirobi-indanes, such as 3,3,3',3'-tetramethyl-1,1'-spirobi-indane-5, 6,5',6'-tetrol, 3,3,3',3'-tetramethyl-1,1'-spirobi-indane-5,6,7, 5',6',7'-hexol, 3,3,3',3'-tetramethyl-1,1'-spirobi-indane-4,5,6, 4',5',6'-hexol and 3,3,3',3'-tetramethyl-1,1'-spirobi-indane-4, 5,6,5',6',7'-hexol; polyhydroxyphthalides, such as 3,3-bis(3, 4-dihydroxyphenyl)phthalide, 3,3-bis(2,3,4-trihydroxyphenyl)phthalide and 3',4',5',6'-tetrahydroxyspiro [phthalide-3,9'-xanthene]; flavonoid such as morin, quercetin and rutin; the polyhydroxy compounds described in JP-A-04-253058, such as α,α',α"-tris(4-hydroxyphenyl) 1,3,5-triisopropylbenzene, α,α',α"-tris(3,5-dimethyl-4-hydroxyphenyl) 1,3,5-triisopropylbenzene, α,α',α"-tris(3,5-diethyl-4-hydroxyphenyl) 1,3,5-triisopropylbenzene, α,α', α"-tris(3,5-di-n-propyl-4-hydroxyphenyl) 1,3,5-triisopropylbenzene, α,α',α"-tris(3,5-diisopropyl-4-hydroxyphenyl) 1,3,5-triisopropylbenzene, α,α',α"-tris(3,5-di-n-butyl-4-hydroxyphenyl) 1,3,5-triisopropylbenzene, α,α',α"-tris(3-methyl-4-hydroxyphenyl) 1,3,5-triisopropylbenzene, α,α',α"-tris(3-methoxy-4-hydroxyphenyl)1,3,5-triisopropylbenzene, α,α',α"-tris(2,4-dihydroxyphenyl)1,3,5-triisopropylbenzene, 1,3,5-tris(3,5-dimethyl-4-hydroxyphenyl)benzene, 1,3,5-tris(5-methyl-2-hydroxyphenyl)benzene, 2,4,6-tris(3,5-dimethyl-4-hydroxyphenylthiomethyl)mesitylene, 1-[α-methyl-α-(4'-hydroxyphenyl)ethyl]-4-[α,α'-bis(4"-hydroxyphenyl)ethyl] benzene, 1-[α-methyl-α-(4'-hydroxyphenyl)ethyl]-3-[α,α'-bis(4"-hydroxyphenyl)ethyl]benzene, 1-[α-methyl-α-(3',5'-dimethyl-4'-hydroxyphenyl)ethyl]-4-[α,α'-bis(3", 5"-dimethyl-4"-hydroxyphenyl)ethyl]benzene, 1-[α-methyl-α-(3'-methyl-4'-hydroxyphenyl)ethyl]-4-[α',α'-bis (3"-methyl-4"-hydroxyphenyl)ethyl]benzene, 1-[α-methyl-α-(3'-methoxy-4'-hydroxyphenyl)ethyl]-4-[α',α'-bis(3"-methoxy-4"-hydroxyphenyl)ethyl]benzene, 1-[α-methyl-α-(2',4'-dihydroxyphenyl)ethyl]-4-[α',α'-bis(4"-hydroxyphenyl)ethyl]benzene and 1-[α-methyl-α-(2',4'-dihydroxyphenyl)ethyl]-3-[α',α'-bis(4"-hydroxyphenyl) ethyl]benzene; and other polyhydroxy compounds, such as p-bis(2,3,4-trihydroxybenzoyl)benzene, p-bis(2,4,6-trihydroxybenzoyl)benzene, m-bis(2,3,4-trihydroxybenzoyl)benzene, m-bis(2,4,6-trihydroxybenzoyl)benzene, p-bis(2,5-dihydroxy-3-bromobenzoyl)benzene, p-bis(2,3,4-trihydroxy-5-methylbenzoyl)benzene, p-bis(2,3,4-trihydroxy-5-methoxybenzoyl)benzene, p-bis(2,3,4-trihydroxy-5-nitrobenzoyl)benzene, p-bis(2,3,4-trihydroxy-5-cyanobenzoyl)benzene, 1,3,5-tris(2,5-dihydroxybenzoyl) benzene, 1,3,5-tris(2,3,4-trihydroxybenzoyl)benzene, 1,2,3-tris(2,3,4-trihydrotrihydryl)benzene, 1,2,4-tris(2,3,4-trihydroxybenzoyl)benzene, 1,2,4,5-tetrakis(2,3,4-trihydroxybenzoyl)benzene, α,α'-bis(2,3,4-trihydroxybenzoyl)-p-xylene, α,α',α'-tris(2,3,4-trihydroxybenzoyl)mesitylene, 2,6-bis(2'-hydroxy-3',5'-dimethylbenzyl)-p-cresol, 2,6-bis(2'-hydroxy-5'-methylbenzyl)-p-cresol, 2,6-bis(2'-hydroxy-3',5'-di-t-butylbenzyl)-p-cresol, 2,6-bis(2'-hydroxy-5'-ethylbenzyl)-p-cresol, 2,6-bis(2',4'-dihydroxybenzyl)-p-cresol, 2,6-bis(2'-hydroxy-3'-t-butyl-5'-methylbenzyl)-p-cresol, 2,6-bis(2'3', 4'-trihydroxy-5'-acetylbenzyl)-p-cresol, 2,6-bis(2',4',6'-trihydroxybenzyl)-p-cresol, 2,6-bis(2',3',4'-trihydroxybenzyl)-p-cresol, 2,6-bis(2',3',4'-trihydroxybenzyl)-3,5-dimethylphenol, 4,6-bis(4'-hydroxy-3',5'-dimethylbenzyl)pyrogallol, 4,6-bis(4'-hydroxy-3',5'-dimethoxybenzyl)pyrogallol, 2,6-bis(4'-hydroxy-3',5'-dimethylbenzyl)-1,3,4-trihydroxyphenol, 4,6-bis(2',4',6'-trihydroxybenzyl)-2,4-dimethylphenol and 4,6-bis(2',3',4'-trihydroxybenzyl)-2,5-dimethylphenol.

Also, phenol resins, such as novolak resins, of the type which contain small number of nuclei can be used.

Further, the polyhydroxy compounds as illustrated below can be used, too:

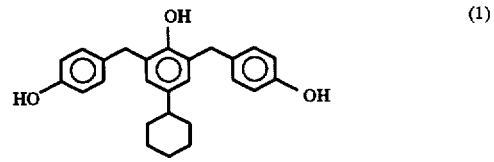

(1)

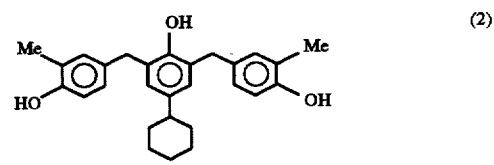

(2)

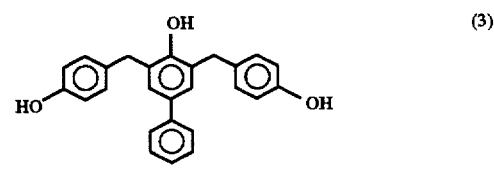

(3)

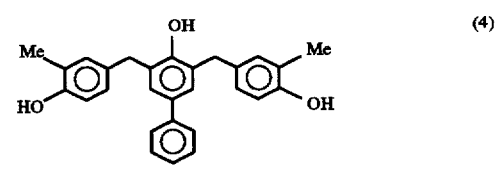

(4)

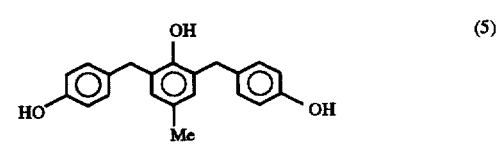

(5)

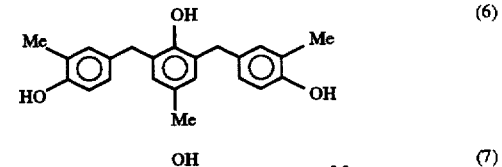

(6)

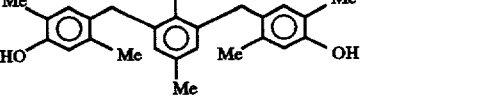

(7)

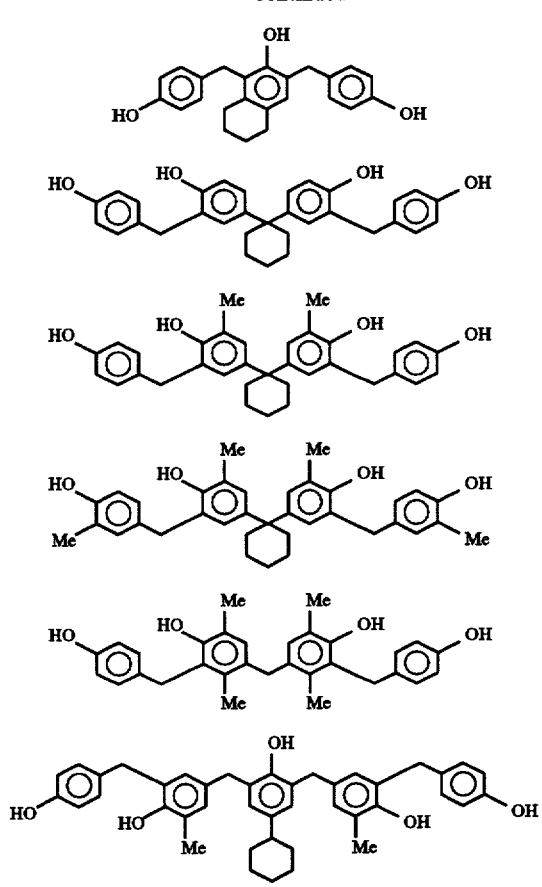

The esterification reaction for obtaining the photosensitive material described hereinbefore is achieved by dissolving prescribed amounts of polyhydroxy compound and 1,2-naphthoquinonediazide-5-(and/or -4-)sulfonyl chloride in a solvent, such as dioxane, acetone, tetrahydrofuran, methyl ethyl ketone, N-methylpyrrolidone, chloroform, trichloroethane, trichloroethylene or dichloroethane, and conducting condensation therein by adding dropwise thereto a basic catalyst, such as sodium hydroxide, sodium carbonate, sodium hydrogen carbonate, triethylamine, N-methylmorpholine, N-methylpiperazine or 4-dimethylaminopyridine. The thus obtained product is washed with water, purified, and then dried.

In a general esterification reaction, the product obtained is a mixture of esterified compounds differing in esterification number and esterified site. However, it is also possible to selectively esterify some particular isomer alone by choosing the reaction condition and the structure of a polyhydroxy compound to be esterified. The term "esterification rate" as used in the present invention refers to the average of esterification rates of the aforesaid mixture.

The esterification rate as defined above can be controlled by properly choosing the ratio between starting materials to be mixed, namely a polyhydroxy compound and 1,2-naphthoquinonediazide-5-(and/or -4-)sulfonyl chloride. More specifically, since substantially all the 1,2-naphthoquinonediazide-5-(and/or -4-)sulfonyl chloride added undergoes the esterification reaction, a mixture having a desired esterification rate can be obtained by adjusting the molar ratio between the starting materials.

1,2-Naphthoquinonediazide-5-sulfonyl chloride and 1,2-naphthoquinonediazide-4-sulfonyl chloride may be used together, if desired.

The reaction temperature in the foregoing method is generally from -20° C. to 60° C., and preferably from 0° to 40° C.

In the photoresist composition of the present invention, the photosensitive compound prepared in the manner as described above may be used as a single compound or a mixture of two or more compounds, and mixed with an alkali-soluble resin. The amount of the photosensitive compound to be mixed is from 5 to 150 parts by weight, preferably from 20 to 100 parts by weight, per 100 parts by weight of alkali-soluble resin. When the amount used is less than 5 parts by weight, the remaining rate of resist film is considerably low; while it is increased beyond 150 parts by weight, the sensitivity and the solubility in a solvent are lowered.

In the photoresist composition of the present invention, a polyhydroxy compound can further be used for the purpose of promoting the dissolution in a developer. Suitable examples of such a polyhydroxy compound include phenols, resorcinol, phloroglucinol, 2,3,4-trihydroxybenzophenone, 2,3,4,4'-tetrahydroxybenzophenone, 2,3,4,3',4',5'-hexahydroxybenzophenone, acetone-pyrogallol condensed resin, phloroglucidol, 2,4,2',4'-biphenyltetrol, 4,4'-thiobis(1,3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenyl sulfone, tris(4-hydroxyphenyl) methane, 1,1-bis(4-hydroxyphenyl)cyclohexane, 4,4'-(α-methylbenzylidene)bisphenol, α,α',α"-tris(4-hydroxyphenyl)-1,3,5-triisopropylbenzene, α,α',α"-tris(4-hydroxyphenyl)-1-ethyl-4-isopropylbenzene, 1,2,2-tris(hydroxyphenyl)propane, 1,1,2-tris(3,5-dimethyl-4-hydroxyphenyl)propane, 2,2,5,5-tetrakis(4-hydroxyphenyl)hexane, 1,2-tetrakis(4-hydroxyphenyl)ethane, 1,1,3-tris(hydroxyphenyl)butane and para[α,α,α',α'-tetrakis(4-hydroxyphenyl)]xylene.

These polyhydroxy compounds can be mixed in a proportion of generally no greater than 100 parts by weight, preferably from 5 to 70 parts by weight, to 100 parts by weight of quinonediazide compound.

Examples of a solvent which can be used for dissolving the photosensitive material and alkali-soluble novolak resin of the present invention include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol methyl ether acetate, propylene glycol propyl ether acetate, toluene, xylene, methyl ethyl ketone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, and propylene glycol monomethyl ether propionate. These organic solvents are used alone or as a mixture of two or more thereof.

Also, such an organic solvent as cited above can be used in combination with a high boiling point solvent, such as N-methylformamide, N,N-dimethylformamide, N-methylacetamide, N,N-dimethylacetamide, N-methylpyrrolidone, dimethyl sulfoxide and benzyl ethyl ether.

Into the positive working photoresist composition of the present invention, a surfactant can be blended in order to improve upon coating properties, such as striation.

As examples of a surfactant which can be used for the aforesaid purpose, mention may be made of nonionic surfactants including polyoxyethylene alkyl ethers, such as polyoxyethylene lauryl ether, polyoxyethylene stearyl ether, polyoxyethylene cetyl ether and polyoxyethylene oleyl ether; polyoxyethylene alkyl aryl ethers, such as polyoxyethylene octyl phenol ether and polyoxyethylene nonyl phenol ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate and sorbitan tristearate; and polyoxyethylenesorbitan fatty acid esters, such as polyoxyethylenesorbitan monolaurate, polyoxyethylenesorbitan monopalmitate, polyoxyethylenesorbitan monostearate, polyoxyethylenesorbitan trioleate and polyoxyethylenesorbitan tristearate: fluorine-containing surfactants, such as Eftop EF 301, EF303 and EF352 (trade names, products of Shin Akita Kasei Co., Ltd.), Megafac F171 and F173 (trade names, products of Dainippon Ink & Chemicals, Inc.), Florad FC430 and FC431 (trade names, products of Sumitomo 3M), and Asahi Guard AG710, Surflon S-382, SC101, SC102, SC103, SC104, SC105 and SC106 (trade names, products of Asahi Glass Company Ltd.); organosiloxane polymers, such as KP341 (code name, a product of Shin-Etsu Chemical Industry Co., Ltd.): and acrylic acid or methacrylic acid (co)polymers, such as Polyflow No. 75 and No. 95 (trade name, products of Kyoeisha Yushi Kagaku Kogyo K.K.). Such a surfactant as cited above is generally blended in a proportion of no greater than 2 parts by weight, preferably no greater than 1 part by weight, to 100 parts by weight of the total of alkali-soluble resin(s) and quinonediazide compound(s) in the present composition.

Those surfactants may be added alone or as a mixture of some of them.

Developing solutions which can be used for the positive working photoresist composition of the present invention are water solutions of alkalis, including inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide, tetraethylammonium hydroxide and choline, and cyclic amines such as pyrrole and piperidine. Also, the water solutions of those alkalis can be admixed with appropriate amounts of an alcohol, such as isopropyl alcohol, and a surfactant of, e.g., nonionic type.

In the positive working photoresist composition of the present invention, a light absorbent, a cross-linking agent, an adhesion assistant and so on can be blended, if needed. The light absorbent is added for the purpose of inhibiting halation from a substrate or enhancing visibility when the photoresist composition is coated on a transparent support, if needed. Suitable examples of such a light absorbent include commercially available ones as described, e.g., in *Kogyo-yo Shikiso no Gijutsu to Shijo* (which means "Arts and Market of Industrial Dyes") published by CMC Shuppan and Senryo Binran (which means "Handbook of Dyes) compiled by Yuki Gosei Kagaku Kyokai, such as C.I. Disperse Yellow 1, 3, 4, 5, 7, 8, 13, 23, 31, 49, 50, 51, 54, 56, 60, 64, 66, 68, 79, 82, 88, 90, 93,, 102, 114 and 124, C.I. Disperse Orange 1, 5, 13, 25, 29, 30, 31, 44, 57, 72 and 73, C.I. Disperse Red 1, 5, 7, 13, 17, 19, 43, 50, 54, 58, 65, 72, 73, 88, 117, 137, 143, 199 and 210, C.I. Disperse Violet 43, C.I. Disperse Blue 96, C.I. Fluorescent Brightening Agent 112, 135 and 165, C.I. Solvent Yellow 14, 16, 33 and 56, C.I. Solvent Orange 2 and 45, C.I. Solvent Red 1, 3, 8, 23, 24, 25, 27 and 49, C.I. Pigment Green 10, and C.I. Pigment Brown 2. The light absorbent as cited above is generally blended in a proportion of no greater than 100 parts by weight, preferably no greater than 50 parts by weight, and more preferably no greater than 30 parts by weight, to 100 parts by weight of alkali-soluble resin(s).

So far as it has no significant influence for the formation of positive images, a cross-linking agent is added. The addition of a cross-linking agent is intended mainly for adjustment of sensitivity and improvements in heat resistance and dry etching resistance.

As examples of a cross-linking agent which can be used, mention may be made of compounds obtained by acting formaldehyde on melamine, benzoguanamine, glycoluril and the like, alkyl-modified compounds thereof, epoxy compounds, aldehydes, azide compounds, organic peroxides, and hexamethylenetetramine. These cross-linking agents can be blended in a proportion of less than 10 parts by weight, preferably less than 5 parts by weight, to 100 parts by weight of a light-sensitive agent. When the amount of a cross-linking agent blended is increased beyond 10 parts by weight, undesirable things including a drop in sensitivity and generation of scum (resist residue) are caused.

An adhesion assistant is added for the purpose of heightening the adhesiveness of the resist to a substrate, thereby preventing the resist from peeling off, particularly in an etching step. Specific examples thereof include chlorosilanes, such as trimethylchlorosilane, dimethylvinylchlorosilane, methyldiphenylchlorosilane and chloromethyldimethylchlorosilane; alkoxysilanes, such as trimethylmethoxysilane, dimethyldiethoxysilane, methyldimethoxysilane, dimethylvinylethoxysilane, diphenyldimethoxysilane and phenyltriethoxysilane; silazanes, such as hexamethyldisilazane, N,N'-bis(trimethylsilyl)urea, dimethyltrimethylsilylamine and trimethylsilylimidazole; silanes, such as vinyltrichlorosilane, γ-chloropropyltrimethoxysilane, γ-aminopropyltriethoxysilane and γ-glycidoxypropyltrimethoxysilane; heterocyclic compounds, such as benzotriazole, benzimidazole, indazole, imidazole, 2-mercaptobenzimidazole, 2-mercaptobenzothiazole, 2-mercaptobenzoxazole, urazole, thiouracil, mercaptoimidazole and mercaptopyrimidine; and urea compounds, such as 1,1-dimethylurea and 1,3-dimethylurea, or thiourea compounds.

These adhesion assistants are blended in a proportion of generally less than 10 parts by weight, preferably less than 5 parts by weight, to 100 parts by weight of alkali-soluble resin(s).

The positive working photoresist composition as mentioned above is coated on a substrate suitable for production of precision integrated circuit elements (e.g., a transparent substrate such as silicon/silicon dioxide-coated glass substrate and ITO substrate) by an appropriate coating means, such as a spinner or coater. The thus coated composition is subjected successively to prebake, exposure to light via a desired mask, PEB (PEB: Post Exposure Bake) if needed, development, rinsing and drying to provide satisfactory resist. The photoresist composition of the present invention can also applied to a PS plate.

The present invention will now be illustrated in more detail by reference to the following Examples which are not to be considered as limiting on the scope of the invention. Additionally, all "%" are by weight unless otherwise noted.

EXAMPLES

Synthesis of Novolak Resin
(1) Synthesis of Novolak Resin (a-1):

In a 500 ml three-necked flask equipped with a stirrer, a reflux condenser and a thermometer, 81.11 g of m-cresol, 4.87 g of p-cresol, 86.13 g of 2,3-xylenol and 22.82 g of o-vanillin (or 2-hydroxy-3-methoxybenzaldehyde) were placed. Thereto, 5.67 g of oxalic acid dihydrate was added at 90° C. with stirring. After a 30-minute lapse, the bath temperature was raised to 130° C., and the contents was further stirred for 8.5 hours under reflux. Thereto, 102.65 g of an aqueous solution of formaldehyde (37.32%) was added dropwise over a period of 30 minutes. The reaction mixture was refluxed for additional 4 hours, and then admixed with 40 g of ethyl 3-ethoxypropionate. After replacing the reflux condenser by a Liebig condenser, the bath temperature was raised up to 200° C. over a period of about 1 hour, and thereby the formaldehyde remaining unreacted, water and so on were removed. Further, the distillation under ordinary pressure was continued for 1 hour, and then the pressure was gradually reduced to 1 mmHg to remove unreacted monomers. It took 2 hours to distill away the unreacted monomers under reduced pressure.

The fused alkali-soluble novolak resin was recovered after it was cooled to room temperature. The novolak resin thus obtained had a weight-average molecular weight of 6490 (reduced to a polystyrene basis).

A 100 g portion of this novolak resin was dissolved in 1,000 g of acetone, and thereto was added 1,000 g of n-hexane with stirring. Further, the stirring was continued for 30 minutes at room temperature. Then, the resulting solution was allowed to stand for 1 hour. The upper layer was removed by decantation, and the solvent was distilled away from the residual lower layer by means of a rotary evaporator. Thus, a solid novolak resin (a-1) was obtained. The weight-average molecular weight of the novolak resin (a-1) was 11,060 (reduced to a polystyrene basis) and the dispersion degree thereof was 2.5.

(2) Synthesis of Novolak Resin (a-2):

In a 500 ml three-necked flask equipped with a stirrer, a reflux condenser and a thermometer, 81.11 g of m-cresol, 4.87 g of p-cresol, 86.13 g of 2,3-xylenol, 22.82 g of o-vanillin and 12.07 g of an aqueous solution of formaldehyde (37.32%) were placed. Thereto, 5.67 g of oxalic acid dihydrate was added at 90° C. with stirring. After a 30-minute lapse, the bath temperature was raised to 130° C., and the contents was further stirred for 12.5 hours under reflux. Thereto, 90.58 g of an aqueous solution of formaldehyde (37.32%) was added dropwise over a period of 30 minutes. The reaction mixture was refluxed for additional 4 hours, and then admixed with 40 g of ethyl 3-ethoxypropionate. After replacing the reflux condenser by a Liebig condenser, the bath temperature was raised up to 200° C. over a period of about 1 hour, and thereby the formaldehyde remaining unreacted, water and so on were removed. Further, the distillation under ordinary pressure was continued for 1 hour, and then the pressure was gradually reduced to 1 mmHg to remove unreacted monomers. It took 2 hours to distill away the unreacted monomers under reduced pressure.

The fused alkali-soluble novolak resin was recovered after it was cooled to room temperature. The novolak resin thus obtained had a weight-average molecular weight of 5620 (reduced to a polystyrene basis).

A 100 g portion of this novolak resin was dissolved in 1,000 g of acetone, and thereto was added 1,000 g of n-hexane with stirring. Further, the stirring was continued for 30 minutes at room temperature. Then, the resulting solution was allowed to stand for 1 hour. The upper layer was removed by decantation, and the solvent was distilled away from the residual lower layer by means of a rotary evaporator. Thus, a solid novolak resin (a-2) was obtained. The weight-average molecular weight of the novolak resin (a-2) was 10,270 (reduced to a polystyrene basis) and the dispersion degree thereof was 2.6.

(3) Synthesis of Novolak Resin (a-3):

In a 1,000 ml three-necked flask equipped with a stirrer, a reflux condenser and a thermometer, 54.98 g of 2,3-xylenol and 45.65 g of o-vanillin were placed, and heated at 90° C. with stirring. Thereto, 0.86 g of p-toluenesulfonic acid was added. After a 30-minute lapse, the bath temperature was raised to 130° C. and the contents were stirred for 5 hours under reflux. Thereto, 162.21 g of m-cresol, 9.73 g of p-cresol, 117.28 g of 2,3-xylenol and 229.45 g of an aqueous solution of formaldehyde (37.30%) were added dropwise over a 30-minute period. The reaction mixture was further refluxed for 4 hours, and then admixed with 100 g of ethyl 3-ethoxypropionate. Thereafter, the bath temperature was lowered to 80° C. The reaction mixture was admixed with 300 ml each of ion exchange water, stirred, and decanted for three times.

Thereafter, the reflux condenser was replaced by a Liebig condenser, and the bath temperature was raised up to 200° C. over a period of about 1 hour to remove the formaldehyde remaining unreacted, water and so on. Further, the distillation under ordinary pressure was continued for 1 hour, and then the pressure was gradually reduced to 1 mmHg to remove unreacted monomers. It took 2 hours to distill away the unreacted monomers under reduced pressure.

The fused alkali-soluble novolak resin was recovered after it was cooled to room temperature. The novolak resin thus obtained had a weight-average molecular weight of 3930 (reduced to a polystyrene basis).

A 100 g portion of this novolak resin was dissolved in 1,000 g of acetone, and thereto was added 1,500 g of n-hexane with stirring. Further, the stirring was continued for 30 minutes at room temperature. Then, the resulting solution was allowed to stand for 1 hour. The upper layer was removed by decantation, and the solvent was distilled away from the residual lower layer by means of a rotary evaporator. Thus, a solid novolak resin (a-3) was obtained. The weight-average molecular weight of the novolak resin (a-3) was 5,890 (reduced to a polystyrene basis) and the dispersion degree thereof was 2.5.

(4) Syntheses of Novolak Resins (a-4) to (a-10):

The intended amounts of monomers and aromatic aldehydes were prepared as set forth in Table 1, and subjected to polymerization and fractionation in the same manner as in Synthesis (1), thereby obtaining novolak resins (a-4) to (a-10) respectively. (In Table 1, the amounts of monomers charged in each synthesis is expressed in terms of the ratio by mole, wherein the total amount of the charged monomers is adjusted to 1.5 moles. Further, the amount of aromatic aldehyde charged in each synthesis is expressed in mole %, or a proportion by mole to the total amount (i.e., 1.5 moles) of monomers used in combination therewith.)

(5) Synthesis of Novolak Resin (a-11):

In a 1 l three-necked flask equipped with a stirrer, a reflux condenser and a thermometer, 14.27 g of 2,2'-dihydroxy-5, 5'-dimethyldiphenylmethane, 5.41 g of o-cresol, 198.53 g of 2,3-xylenol, 68.10 g of 2,3,5-trimethylphenol, 24.43 g of 2,6-xylenol and 38.04 g of o-vanillin were placed, and thereto 50 g of ethyl 3-ethoxypropionate was further added. The resultant mixture was heated at 90° C. with stirring, and thereto 9.46 g of oxalic acid dihydrate was added. After a 1-hour lapse, the bath temperature was raised to 130° C., and the contents was refluxed for additional 30 hours with stirring. Then, 9.46 g of oxalic acid dihydrate was added again, and the reaction mixture was further refluxed for 13 hours. Thereto, 245.30 g of an aqueous solution of formaldehyde (37.30%) was added, and the resultant solution was refluxed at 130° C. for 12 hours, and then admixed with 25 g of ethyl 3-ethoxypropionate. Further, the resultant mixture was refluxed for 6 hours. Thereto, 25 g of ethyl 3-ethoxypropionate was added again. Thereafter, the reflux condenser was replaced by a Liebig condenser, and the bath temperature was raised up to 200° C. over a period of about 1 hour to remove the formaldehyde remaining unreacted, water and so on. It took 3 hours to distill away the unreacted formaldehyde, water and so on. The heating was ceased, and thereby the temperature inside the flask was lowered to 180° C. Thereupon, 620 g of ethyl lactate was added little by little to the reaction product, thereby obtaining the ethyl lactate solution of a novolak resin (a-11). The novolak resin (a-11) thus obtained had a weight-average molecular weight of 3250 (reduced to a polystyrene basis), and the dispersion degree thereof was 2.3.

(6) Syntheses of Novolak Resins (b-1) and (b-2):

The intended amounts of monomers and aromatic aldehydes were charged as set forth in Table 2, and subjected to polymerization and fractionation in the same manner as in Synthesis (1), thereby obtaining novolak resins (b-1) and (b-2) respectively. (In Table 2, the amounts of monomers charged in each synthesis is expressed in terms of the ratio by mole, wherein the total amount of the charged monomers is adjusted to 1.5 moles. Further, the amount of aromatic aldehyde charged in each synthesis is expressed in mole %, or a proportion by mole to the total amount (i.e., 1.5 moles) of monomers used in combination therewith.)

TABLE 1

Syntheses of Novolak Resins (a-1) to (a-10)

| Novolak Resin | Monomers Charged | | Aromatic Aldehyde | | Molecular weight | | Dispersion Degree |
|---|---|---|---|---|---|---|---|
| | species* | ratio (by mole) | species | amount used (mole %) | before fractionation | after fractionation | |
| a-1 | m/p/2,3Xy | 50/3/47 | 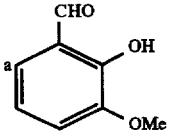 CHO, OH, OMe (a) | 10 | 6490 | 11060 | 2.5 |
| a-2 | m/p/2,3Xy | 50/3/47 | (a) | 10 | 5620 | 10270 | 2.6 |
| a-3 | m/p/2,3Xy | 50/3/47 | (a) | 10 | 3930 | 5890 | 2.5 |
| a-4 | m/p/2,3Xy | 60/20/20 | (a) | 15 | 6380 | 9850 | 2.7 |
| a-5 | m/2,3Xy | 60/40 | (a) | 15 | 5510 | 8000 | 2.6 |
| a-6 | m/p/3,5Xy | 60/3/37 | (a) | 10 | 3820 | 6680 | 2.4 |
| a-7 | m/p | 50/50 | (a) | 10 | 6370 | 9980 | 2.7 |
| a-8 | m/p/2,3Xy | 50/3/47 | 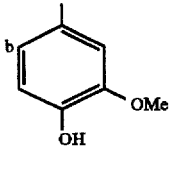 CHO, OMe, OH (b) | 10 | 5640 | 9770 | 2.7 |
| a-9 | m/p/2,3Xy | 50/3/47 | 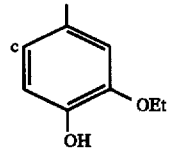 CHO, OEt, OH (c) | 10 | 5060 | 8110 | 2.6 |
| a-10 | m/p/2,3Xy | 50/3/47 | 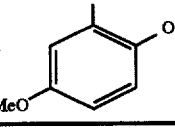 CHO, OH, MeO (d) | 10 | 4750 | 7910 | 2.6 |

As for the species of monomers put a mark * in Table 1, m stands for m-cresol, p for p-cresol, 2,3Xy for 2,3-xylenol and 3,5Xy for 3,5-xylenol.

TABLE 2

Syntheses of Novolak Resins (b-1) and (b-2)

| Novolak Resin | Monomers Charged | | Aromatic Aldehyde | | Molecular weight | | Dispersion Degree |
|---|---|---|---|---|---|---|---|
| | species | ratio (by mole) | species | amount used (mole %) | before fractionation | after fractionation | |
| b-1 | m/p/2,3Xy | 50/3/47 | benzaldehyde | 10 | 4470 | 8930 | 2.6 |
| b-2 | m/p/2,3Xy | 50/3/47 | salicylaldehyde | 10 | 4290 | 8580 | 2.5 |

(7) Synthesis of Novolak Resin (b-3):

In a 500 ml three-necked flask equipped with a stirrer, a reflux condenser and a thermometer, 81.11 g of m-cresol, 4.87 g of p-cresol, 86.13 g of 2,3-xylenol and 159.76 g of o-vanillin were placed. Thereto, 1.95 g of hydrochloric acid was added dropwise at 90° C. with stirring. After a 30-minute lapse, the bath temperature was raised to 130° C., and the contents was further stirred for 8.5 hours to undergo reaction. Then, 40 g of ethyl 3-ethoxypropionate was added to the reaction mixture. After replacing the reflux condenser by a Liebig condenser, the bath temperature was raised up to 200° C. over a period of about 1 hour to remove hydrochloric acid, water and so on. Further, the distillation under ordinary pressure was continued for 1 hour, and then the pressure was gradually reduced to 1 mmHg to remove unreacted monomers. It took 2 hours to distill away the unreacted monomers under reduced pressure.

The fused alkali-soluble novolak resin was recovered after it was cooled to room temperature. The novolak resin thus obtained had a weight-average molecular weight of 5170 (reduced to a polystyrene basis).

A 100 g portion of this novolak resin was dissolved in 1,000 g of acetone, and thereto was added 1,000 g of n-hexane with stirring. Further, the stirring was continued for 30 minutes at room temperature. Then, the resulting solution was allowed to stand for 1 hour. The upper layer was removed by decantation, and the solvent was distilled away from the residual lower layer by means of a rotary evaporator. Thus, a solid novolak resin (b-3) was obtained. The weight-average molecular weight of the novolak resin (b-3) was 9,730 (reduced to a polystyrene basis) and the dispersion degree thereof was 2.6.

Synthesis of Photosensitive Material (8) Synthesis of Photosensitive Material (S-1):

In a three-necked flask, 62.9 g of Compound (1) illustrated in Table 3, 53.7 g of 1,2-naphthoquinonediazide-5-sulfonyl chloride and 800 ml of acetone were placed, and mixed homogeneously to make a solution. Then, 21.2 g of triethylamine was slowly dripped into the solution, and therein the reaction was run for 3 hours at 25° C. The reaction mixture thus obtained was poured into 3 l of a 1% water solution of hydrogen chloride to precipitate the intended product. The precipitated product was filtered off, washed with water and dried. Thus, a photosensitive material (S-1) was obtained.

(9) Synthesis of Photosensitive Material (S-2):

In a three-necked flask, 53.8 g of Compound (2) illustrated in Table 3, 53.7 g of 1,2-naphthoquinonediazide-5-sulfonyl chloride and 800 ml of acetone were placed, and mixed homogeneously to make a solution. Then, 21.2 g of triethylamine was slowly dripped into the solution, and therein the reaction was run for 3 hours at 25° C. The reaction mixture thus obtained was poured into 3 l of a 1% water solution of hydrogen chloride to precipitate the intended product. The precipitated product was filtered off, washed with water and dried. Thus, a photosensitive material (S-2) was obtained.

(10) Synthesis of Photosensitive Material (S-3):

In a three-necked flask, 56.5 g of Compound (3) illustrated in Table 3, 53.7 g of 1,2-naphthoquinonediazide-5-sulfonyl chloride and 800 ml of acetone were placed, and mixed homogeneously to make a solution. Then, 21.2 g of triethylamine was slowly dripped into the solution, and therein the reaction was run for 3 hours at 25° C. The reaction mixture thus obtained was poured into 3 l of a 1% water solution of hydrogen chloride to precipitate the intended product. The precipitated product was filtered off, washed with water and dried. Thus, a photosensitive material (S-3) was obtained.

TABLE 3

Compound for Mother Nucleus of Photosensitive Material (1)

TABLE 3-continued

Compound for Mother Nucleus of Photosensitive Material (2) [chemical structure]

(3) [chemical structure]

Preparation and Evaluation of Positive Working Photoresist Compositions

Each of photoresist compositions (Examples 1 to 11 and Comparative Examples 1 to 3) was prepared by mixing each of the novolak resins (a-1) to (a-11) and (b-1) to (b-3) obtained in the aforementioned Syntheses (1) to (6), a photosensitive material chosen from (S-1), (S-2) and (S-3) obtained in the aforementioned Syntheses (7), (8) and (9) respectively, one or two solvents chosen from Solvents (Y-1) to (Y-4) and one of Polyhydroxy Compounds (P-1) to (P-3) illustrated in Table 4 in their respective proportions as set forth in Table 5, making the resultant mixture into a homogeneous solution, and then passing the solution through a microfilter having a pore size of 0.10 µm. Each photoresist composition thus prepared was coated on a silicon wafer by means of a spinner, and dried at 90° C. for 60 seconds with a vacuum contact hot plate, thereby forming a resist film having a thickness of 1.02 µm.

TABLE 4

| Polyhydroxy Compound |
|---|
| P-1 [chemical structure] |

TABLE 4-continued

| Polyhydroxy Compound |
|---|
| P-2 [chemical structure] |
| P-3 [chemical structure] |

| | |
|---|---|
| Y-1: | ethyl cellosolve acetate |
| Y-2: | ethyl 2-hydroxypropionate |
| Y-3: | methyl 3-methoxypropionate |
| Y-4: | ethyl 3-ethoxypropionate |

TABLE 5

Positive Working Photoresist Compositions

| | Novolak Resin | | Photosensitive Material | | Polyhydroxy Compound | | Solvent | |
|---|---|---|---|---|---|---|---|---|
| | Species | Amount added | Species | Amount added | Species | Amount added | Species | Amount added |
| Example 1 | a-1 | 100 | S-2 | 80 | P-1 | 40 | Y-2/Y-4 | 560/140 |
| Example 2 | a-2 | 100 | S-1 | 95 | P-3 | 50 | Y-1 | 775 |
| Example 3 | a-3 | 100 | S-3 | 60 | P-2 | 30 | Y-1 | 600 |
| Example 4 | a-4 | 100 | S-2 | 80 | P-1 | 40 | Y-2/Y-4 | 560/140 |
| Example 5 | a-5 | 100 | S-1 | 95 | P-3 | 40 | Y-3 | 745 |
| Example 6 | a-6 | 100 | S-3 | 65 | P-2 | 35 | Y-1 | 630 |
| Example 7 | a-7 | 100 | S-2 | 80 | P-1 | 45 | Y-2/Y-4 | 570/140 |
| Example 8 | a-8 | 100 | S-1 | 80 | P-3 | 35 | Y-3 | 680 |
| Example 9 | a-9 | 100 | S-3 | 80 | P-2 | 30 | Y-1 | 665 |
| Example 10 | a-10 | 100 | S-2 | 70 | P-1 | 40 | Y-1 | 665 |
| Example 11 | a-11 | 100 | S-2 | 80 | P-2 | 40 | Y-2/Y-4 | 560/140 |
| Comparative Example 1 | b-1 | 100 | S-2 | 80 | P-1 | 40 | Y-2/Y-4 | 560/140 |
| Comparative Example 2 | b-2 | 100 | S-2 | 80 | P-1 | 40 | Y-2/Y-4 | 560/140 |
| Comparative Example 3 | b-3 | 100 | S-2 | 80 | P-1 | 40 | Y-2/Y-4 | 560/140 |

Each resist film was exposed to light by means of a reducing projection exposure apparatus (Model NSR-2005i9C, made by Nikon), underwent PEB at 110° C. for 60 seconds, developed for 1 minute with a 2.38% of water solution of tetramethylammonium hydroxide, washed with water for 30 seconds, and then dried.

Each resist pattern thus obtained on the silicon wafer was observed under a scanning electron microscope, and thereby the resist performance was evaluated. The evaluation results are shown in Table 6.

In the evaluation, the sensitivity is defined as the reciprocal of the exposure amount required for reproducing a 0.40 μm mask pattern, and shown as relative value, with the resist of Comparative Example 1 being taken as 1.0.

The resolving power was expressed as the limiting resolving power under the exposure for reproducing a 0.40 μm mask pattern. In evaluating a defocus latitude, the focus range in which a 0.40 μm resist pattern was resolved without a decrease in film thickness under the effective speed was examined by profile observation under a scanning electron microscope.

The heat resistance was represented by the temperature at which the edge part of a 0.50 μm line pattern began to round. The Deep UV curability was evaluated as follows: A resist pattern formed on the silicon wafer in the aforementioned manner was irradiated with deep ultraviolet rays for 60 seconds as the temperature thereof was raised by heating (initial temperature: 100° C., final temperature: 200° C.). This operation was carried out using an apparatus AEW-612 made by Dai-Nippon Screen Mfg. Co., Ltd. Thereafter, the resist pattern was dipped in isoamyl acetate for 1 minute (for etching), dried, and then observed under a scanning electron microscope. The marks in Table 6 represent the following cases:

A: A case where the resist pattern was not at all etched, or neither deformation nor roughening was caused in the pattern (complete curing).

B: A case where the resist pattern was slightly etched in a part where it was in contact with the substrate, or slight deformation and roughening were caused in the pattern.

C: The resist pattern was considerably etched in a part where it was in contact with the substrate, or considerable deformation and roughening were caused in the pattern.

TABLE 6

Evaluation Results

| | Relative Sensitivity | Resolving Power (μm) | Defocus Latitude (μm) | Heat Resistance (°C.) | Deep UV Curability |
|---|---|---|---|---|---|
| Example 1 | 1.4 | 0.28 | 1.7 | 145 | A |
| Example 2 | 1.3 | 0.28 | 1.8 | 145 | A |
| Example 3 | 1.4 | 0.28 | 1.9 | 145 | A |
| Example 4 | 1.2 | 0.29 | 1.6 | 145 | A |
| Example 5 | 1.2 | 0.29 | 1.6 | 140 | A |
| Example 6 | 1.3 | 0.3 | 1.6 | 140 | A |
| Example 7 | 1.4 | 0.3 | 1.5 | 140 | A |
| Example 8 | 1.3 | 0.29 | 1.8 | 145 | A |
| Example 9 | 1.3 | 0.29 | 1.7 | 145 | A |
| Example 10 | 1.3 | 0.29 | 1.8 | 145 | A |
| Example 11 | 1.2 | 0.28 | 1.8 | 145 | A |
| Comparative Example 1 | 1.0 | 0.36 | 1 | 135 | B |
| Comparative Example 2 | 1.2 | 0.32 | 1.2 | 135 | B |
| Comparative Example 3 | 1.1 | 0.34 | 1.2 | 135 | B |

It was confirmed by the evaluation results shown in Table 6 that the positive working photoresists according to the present invention had not only excellent sensitivity, resolving power, defocus latitude and heat resistance, but also highly satisfactory deep UV curability.

In accordance with the present invention, as mentioned above, there can be obtained a positive working photoresist composition which not only has high resolving power and wide defocus latitude and provides a resist image having excellent heat resistance, but also has sufficient Deep UV curability.

While the invention has been described in detail and with reference to specific embodiments thereof, it will be apparent to one skilled in the art that various changes and modification can be made therein without departing from the spirit and scope thereof.

What is claimed is:

1. A positive working photoresist composition comprising an alkali-soluble resin and a 1,2-quinonediazide compound, said alkali-soluble resin being a novolak resin prepared by condensing a phenol compound represented by formula (I), formaldehyde and an aromatic aldehyde compound represented by formula (II);

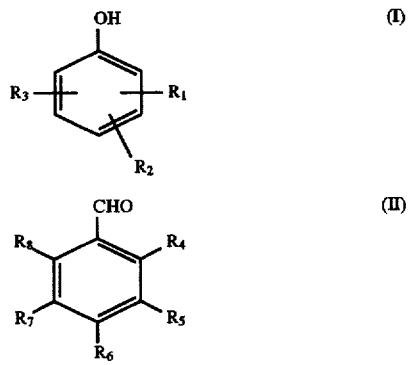

wherein $R_1$, $R_2$ and $R_3$ are the same or different, and each represents a hydrogen atom, a hydroxyl group, a halogen atom, an alkyl group, a cycloalkyl group, an alkoxy group, an alkenyl group, an aryl group, an aralkyl group, an alkoxycarbonyl group or an arylcarbonyl group; and $R_4$ to $R_8$ are the same or different, and each represents a hydrogen atom, a hydroxyl group, a formyl group, a halogen atom, an alkyl group, a cycloalkyl group, an alkoxy group, an alkenyl group, an aryl group, an aralkyl group or a nitro group; provided that at least one of $R_4$ to $R_8$ is a hydroxyl group and at least one of $R_4$ to $R_8$ is an alkoxy group.

2. The positive working photoresist composition as claimed in claim 1, wherein the proportion of said aromatic aldehyde compound is not greater than 40 mole %, to 100 mole % of the phenol component in the composition.

3. The positive working photoresist composition as claimed in claim 1, wherein the proportion of said aromatic aldehyde compound is from 0.1 to less than 30 mole %, to 100 mole % of the phenol component in the composition.

4. The positive working photoresist composition as claimed in claim 1, wherein the proportion of said formaldehyde is from 20 to 150 mole %, to 100 mol % of the phenol compound represented by formula (I).

5. The positive working photoresist composition as claimed in claim 1, wherein the proportion of said formaldehyde is from 50 to 120 mole %, to 100 mol % of the phenol compound represented by formula (I).

6. The positive working photoresist composition as claimed in claim 1, wherein the novolak resin has a weight-average molecular weight of from 3,000 to 20,000.

7. The positive working photoresist composition as claimed in claim 1, wherein the novolak resin has a weight-average molecular weight of from 4,000 to 18,000.

* * * * *